(12) United States Patent
Plettner et al.

(10) Patent No.: US 11,615,939 B2
(45) Date of Patent: Mar. 28, 2023

(54) SHAPED APERTURE SET FOR MULTI-BEAM ARRAY CONFIGURATIONS

(71) Applicant: KLA Corporation, Milpitas, CA (US)

(72) Inventors: Tomas Plettner, Milpitas, CA (US); Ernesto Escorcia, Milpitas, CA (US); Sameet K. Shriyan, San Jose, CA (US); Jeong Ho Lee, Milpitas, CA (US)

(73) Assignee: KLA Corporation, Milpitas, CA (US)

( * ) Notice: Subject to any disclaimer, the term of this patent is extended or adjusted under 35 U.S.C. 154(b) by 2 days.

(21) Appl. No.: 17/211,018

(22) Filed: Mar. 24, 2021

(65) Prior Publication Data

US 2022/0310355 A1    Sep. 29, 2022

(51) Int. Cl.
*H01J 37/26* (2006.01)
*H01J 37/22* (2006.01)
*G01N 23/2251* (2018.01)
*H01J 37/28* (2006.01)

(52) U.S. Cl.
CPC ........ *H01J 37/226* (2013.01); *G01N 23/2251* (2013.01); *G01N 2223/6116* (2013.01); *G01N 2223/646* (2013.01); *H01J 37/28* (2013.01)

(58) Field of Classification Search
CPC .......... H01J 37/226; H01J 37/28; H01J 37/30; H01J 37/3002; H01J 37/3174; H01J 37/3175; G01N 23/2251; G01N 223/6116; G01N 223/646
USPC ..... 250/306, 307, 311, 492.1, 492.2, 492.22, 250/492.3
See application file for complete search history.

(56) References Cited

U.S. PATENT DOCUMENTS

| | | | | |
|---|---|---|---|---|
| 4,316,087 | A | * 2/1982 | Yanaka | H01J 37/04 250/311 |
| 4,841,316 | A | 6/1989 | Pavone et al. | |
| 6,897,454 | B2 | 5/2005 | Sasaki et al. | |
| 2006/0065854 | A1 * | 3/2006 | Shichi | H01J 37/3056 250/492.21 |
| 2007/0263921 | A1 * | 11/2007 | Nakasugi | H01J 37/3174 382/145 |
| 2010/0041176 | A1 | 2/2010 | Sullivan et al. | |
| 2010/0197126 | A1 | 8/2010 | Bateman et al. | |
| 2010/0308236 | A1 | 12/2010 | Carlson et al. | |
| 2013/0052569 | A1 | 2/2013 | Choi et al. | |

(Continued)

FOREIGN PATENT DOCUMENTS

| | | |
|---|---|---|
| EP | 0518783 A1 | 12/1992 |
| JP | 2018195613 A | 12/2018 |

OTHER PUBLICATIONS

WIPO, International Search Report for International Application No. PCT/US2022/018811, dated Jun. 16, 2022.

*Primary Examiner* — Jason L McCormack
(74) *Attorney, Agent, or Firm* — Hodgson Russ LLP (57) ABSTRACT

An aperture array for a multi-beam array system and a method of selecting a subset of a beam from a multi-beam array system are provided. The aperture array comprises an array body arranged proximate to a beam source. The array body comprises a plurality of apertures, at least two of the apertures having different geometries. The array body is movable, via an actuator, relative to an optical axis of the beam source, such that a subset of a beam from the beam source is selected based on the geometry of the aperture that is intersected by the optical axis.

18 Claims, 6 Drawing Sheets

(56) References Cited

U.S. PATENT DOCUMENTS

| | | | |
|---|---|---|---|
| 2014/0273536 A1* | 9/2014 | Nishiyama | H01J 37/3174 250/492.23 |
| 2016/0336141 A1* | 11/2016 | Nomura | H01J 37/063 |
| 2019/0362928 A1* | 11/2019 | Inoue | H01J 37/141 |
| 2020/0027687 A1* | 1/2020 | Cook | H01J 37/244 |
| 2020/0381212 A1* | 12/2020 | Ren | H01J 37/3177 |

* cited by examiner

SHAPED APERTURE SET FOR MULTI-BEAM ARRAY CONFIGURATIONS

FIELD OF THE DISCLOSURE

This disclosure relates to a multi-beam array system and, more particularly, to an aperture array for a multi-beam array system.

BACKGROUND OF THE DISCLOSURE

Evolution of the semiconductor manufacturing industry is placing greater demands on yield management and, in particular, on metrology and inspection systems. Critical dimensions continue to shrink, yet the industry needs to decrease time for achieving high-yield, high-value production. Minimizing the total time from detecting a yield problem to fixing it determines the return-on-investment for a semiconductor manufacturer.

Fabricating semiconductor devices, such as logic and memory devices, typically includes processing a semiconductor wafer using a large number of fabrication processes to form various features and multiple levels of the semiconductor devices. For example, lithography is a semiconductor fabrication process that involves transferring a pattern from a reticle to a photoresist arranged on a semiconductor wafer. Additional examples of semiconductor fabrication processes include, but are not limited to, chemical-mechanical polishing (CMP), etch, deposition, and ion implantation. Multiple semiconductor devices may be fabricated in an arrangement on a single semiconductor wafer that are separated into individual semiconductor devices.

Inspection processes are used at various steps during semiconductor manufacturing to detect defects on wafers to promote higher yield in the manufacturing process and, thus, higher profits. Inspection has always been an important part of fabricating semiconductor devices such as integrated circuits (ICs). However, as the dimensions of semiconductor devices decrease, inspection becomes even more important to the successful manufacture of acceptable semiconductor devices because smaller defects can cause the devices to fail. For instance, as the dimensions of semiconductor devices decrease, detection of defects of decreasing size has become necessary because even relatively small defects may cause unwanted aberrations in the semiconductor devices.

One device used for inspection processes is a multi-beam array. The multi-beam array emits multiple electron beams onto an area of the semiconductor device. During inspection processes, it may be desirable to select only a subset of the electron beams. For example, certain array shapes may be required for different inspection processes, or different array shapes may offer higher resolution images. In a typical inspection system, changing the subset of the electron beams can require swapping individual blankers placed in the optical path of the multi-beam array, or controlling the individual electron beams to turn on or off using a processor. These methods can add cost to the inspection system and/or can require additional maintenance.

Therefore, new methods and devices for selecting a subset of a multi-beam array are needed. These new methods and devices can reduce downtime between inspection processes, add minimal cost to the inspection system, and require little maintenance.

BRIEF SUMMARY OF THE DISCLOSURE

An embodiment of the present disclosure provides an aperture array for a multi-beam array system. The aperture array may comprise an array body arranged proximate to a beam source. The array body may comprise a plurality of apertures. At least two of the apertures may have different geometries. The array body may be movable, via an actuator, relative to an optical axis of the beam source, such that a subset of a beam from the beam source may be selected based on the geometry of the aperture that is intersected by the optical axis.

According to an embodiment of the present disclosure, at least one of the plurality of apertures may be circular.

According to an embodiment of the present disclosure, at least one of the plurality of apertures may be rectangular.

According to an embodiment of the present disclosure, at least one of the plurality of apertures may be hexagonal.

According to an embodiment of the present disclosure, two of the plurality of apertures may have a same shape with different sizes.

According to an embodiment of the present disclosure, the plurality of apertures may be arranged one dimensionally in the array body.

According to an embodiment of the present disclosure, the actuator may comprise a linear actuator configured to move the array body relative to the optical axis of the beam source in an X direction. The X direction may be perpendicular to the optical axis.

According to an embodiment of the present disclosure, the actuator may comprises a rotary actuator configured to rotate the array body relative to the optical axis of the beam source about a rotational axis. The rotational axis may be parallel to the optical axis.

According to an embodiment of the present disclosure, the plurality of apertures may be arranged two dimensionally in the array body.

According to an embodiment of the present disclosure, the actuator may comprise a pair of linear actuators configured to move the array body relative to the optical axis of the beam source in an X direction and a Y direction, respectively. The X direction and the Y direction may be perpendicular to the optical axis and perpendicular to each other.

According to an embodiment of the present disclosure, the array body may be comprised of aluminum nitride, polycrystalline diamond, graphite, molybdenum, or tungsten.

According to an embodiment of the present disclosure, the aperture array may further comprise a heat dissipation device disposed on the array body. The heat dissipation device may be configured to actively or passively dissipate heat from the array body.

According to an embodiment of the present disclosure, a distance between the array body and the beam source may be from 10 cm to 20 cm.

According to an embodiment of the present disclosure, the beam source may be an electron beam source.

An embodiment of the present disclosure provides a method of selecting a subset of a beam from a multi-beam array system. The method may comprise providing an array body proximate to a beam source. The array body may comprise a plurality of apertures. At least two of the apertures may have different geometries. The method may further comprise moving the array body, via an actuator, relative to an optical axis of the beam source such that one of the apertures may be intersected by the optical axis. The method may further comprise generating an electron beam about the optical axis using the beam source. The method may further comprise directing the electron beam through the array body to select a subset of the electron beam based on a shape of the aperture intersected by the optical axis.

According to an embodiment of the present disclosure, at least one of the plurality of apertures may be circular, and when the aperture intersected by the optical axis is circular, the method may further comprise performing a hot spot inspection operation on a portion of a wafer positioned in the optical axis, downstream of the array body.

According to an embodiment of the present disclosure, at least one of the plurality of apertures may be rectangular, and when the aperture intersected by the optical axis is rectangular, the method may further comprise performing a swathing operation on a portion of a wafer positioned in the optical axis, downstream of the array body.

According to an embodiment of the present disclosure, at least one of the plurality of apertures may be hexagonal, and when the aperture intersected by the optical axis is hexagonal, the method may further comprises performing a step and settle operation on a portion of a wafer positioned in the optical axis, downstream of the array body.

According to an embodiment of the present disclosure, the method may further comprise moving the array body, via the actuator, relative to the optical axis of the beam source such that a different one of the apertures is intersected by the optical axis. The method may further comprise directing the electron beam through the array body to select a different subset of the electron beam based on a shape of the different one of the apertures intersected by the optical axis.

According to an embodiment of the present disclosure, a distance between the array body and the beam source may be from 10 cm to 20 cm.

DESCRIPTION OF THE DRAWINGS

For a fuller understanding of the nature and objects of the disclosure, reference should be made to the following detailed description taken in conjunction with the accompanying drawings, in which.

DETAILED DESCRIPTION OF THE DISCLOSURE

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

Figure 1A:
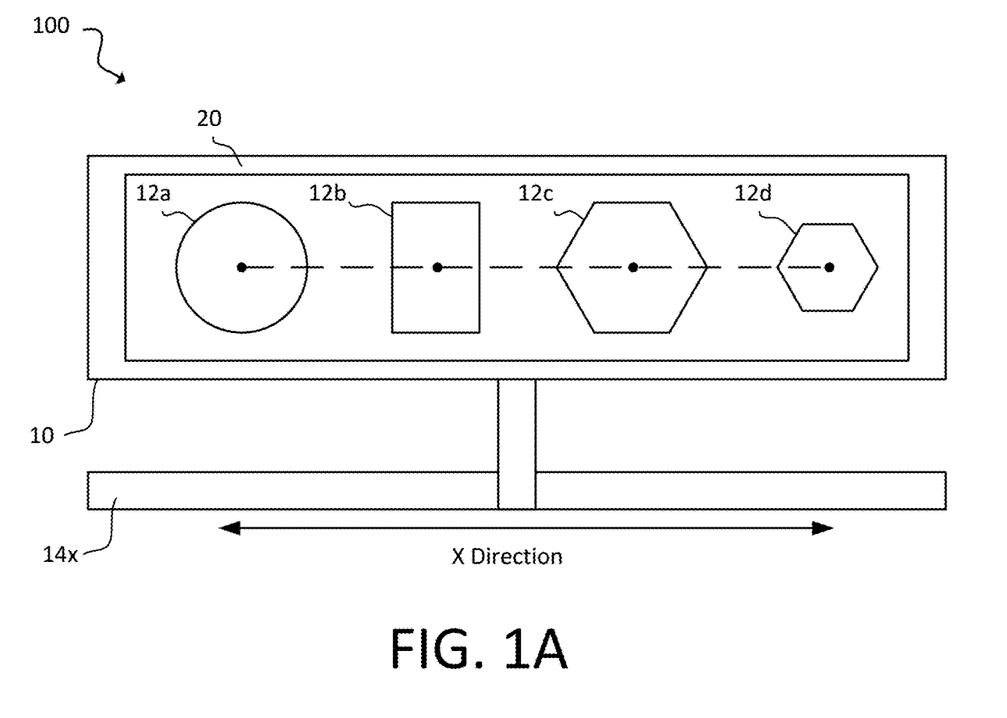
FIG. 1A is a top view of an aperture array according to an embodiment of the present disclosure.

As shown in FIG. 1A, an embodiment of the present disclosure provides an aperture array 100 for a multi-beam array system. The aperture array 100 may comprise an array body 10. The array body 10 may be a plate having a thickness of at least 100 µm. The array body 10 may be comprised of one of the following materials: aluminum nitride, polycrystalline diamond, graphite, molybdenum, and tungsten. Other materials are possible and these materials are merely listed as examples.

The array body 10 may comprise a plurality of apertures 12. The array body 10 may be machined to define the plurality of apertures 12. For example, a laser cutting operation may be used to define the plurality of apertures 12 in the array body 10. Other operations, such as electrical discharge machining (EDM), etching, or any other suitable operation may be used to define the plurality of apertures 12 in the array body 10. At least two of the plurality of apertures 12 may have different geometries. For example, each of the plurality of apertures 12 may have a different size or a different shape. Each of the plurality of apertures 12 may have a size from 1 mm to 25 mm. Each of the plurality of apertures 12 may be suitable for particular operations of the multi-beam array system. The apertures 12 can clip, or block, part of the electron beam.

Figure 2A:
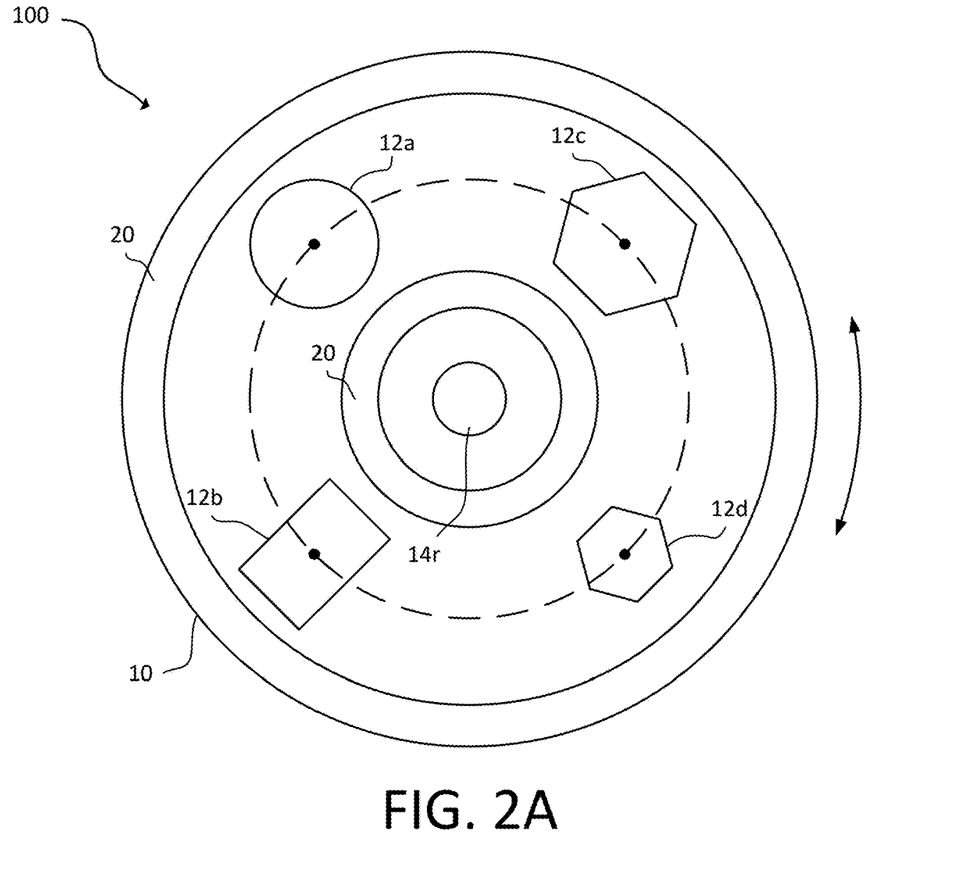
FIG. 2A is a top view of an aperture array according to another embodiment of the present disclosure.
Figure 3A:
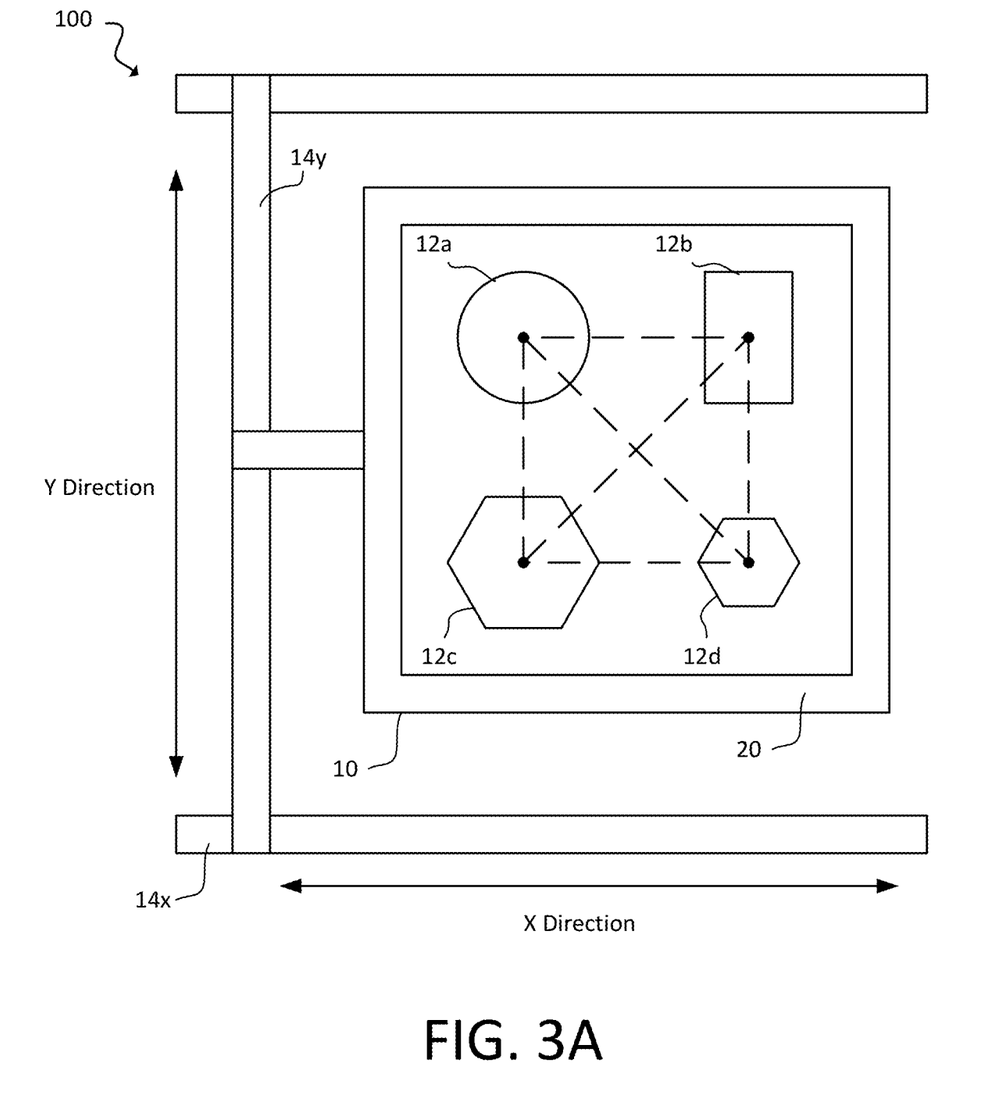
FIG. 3A is a top view of an aperture array according to another embodiment of the present disclosure.

According to an embodiment of the present disclosure, at least one of the plurality of apertures 12 may be circular. For example, as shown in FIGS. 1A, 2A, and 3A, the plurality of apertures 12 may comprise a circular aperture 12a. The circular aperture 12a may be suitable for a hot spot inspection operation. Hot spots are features on semiconductor device or wafer that are susceptible to pattern failures. Additional details of the hot spot inspection are known in the related art and not elaborated here.

According to an embodiment of the present disclosure, at least one of the plurality of apertures 12 may be rectangular. For example, as shown in FIGS. 1A, 2A, and 3A, the plurality of apertures 12 may comprise a rectangular aperture 12b. The rectangular aperture 12b may have an aspect ratio from 1:1 to 2:1. The rectangular aperture 12b may be suitable for a swathing operation. Swathing can take a series of images or scan across a row of semiconductor devices or part of a wafer. For example, the wafer may be moving when the imaging occurs such that a strip of two-dimensional image (a swath) is created. This process can be repeated with multiple such swaths until an entire care area is imaged. Additional details of the swathing operation are known in the related art and not elaborated here.

According to an embodiment of the present disclosure, at least one of the plurality of apertures 12 may be hexagonal. For example, as shown in FIGS. 1A, 2A, and 3A, the plurality of apertures 12 may comprise a hexagonal aperture 12c. The hexagonal aperture 12c may be suitable for a step and settle operation. The wafer can be stationary to capture an image of a wafer at one location, but the wafer can move between various imaging locations. This movement and imaging process can be repeated until an entire care area is imaged during step and settle operation. Additional details of the step and settle operation are known in the related art and not elaborated here.

According to an embodiment of the present disclosure, two of the plurality of apertures 12 may have the same shape but different sizes. A smaller size aperture may provide higher resolution for the operation corresponding to the aperture shape. For example, as shown in FIGS. 1A, 2A, and 3A, the plurality of apertures 12 may comprise a first hexagonal aperture 12c and a second hexagonal aperture 12d. The second hexagonal aperture 12d may provide a higher resolution step and settle operation compared to the first hexagonal aperture 12c.

The array body 10 may be arranged proximate to a beam source in the multi-beam array system. The distance between the array body and the beam source may depend on the design of the system. For example, the array body may be arranged within 10 cm to 20 cm from the beam source. The beam source may be an electron beam source. The beam source may comprise a single beam or may be a multi-beam array, configured to emit multiple beams. The beam source may define an optical axis about which energy from the beam source is directed toward a wafer. The array body 10 may be arranged upstream of any focusing elements in the multi-beam array system. By arranging the array body 10 such that one of the plurality of apertures 12 is intersected by the optical axis of the beam source, unnecessary beams from the beam source may be clipped by the array body 10, and not directed toward the wafer. Accordingly, a subset of the beam from the beam source may be selected based on the geometry of the aperture 12 that is intersected by the optical axis. For example, the aperture 12 may be coincident to the optical axis. It can be appreciated that optimizing the distance between the array body 10 and the beam source may provide the following benefits: (1) less Coulomb effects on the electron beam; (2) less power may be needed to run the beam optics (because some of the electron beam is clipped); and (3) less heat may be generated using the electron beam (because there is less beam current after some of the electron beam is clipped).

The array body 10 may be movable relative to the optical axis of the beam source. By moving the array body 10, the optical axis may intersect a different one of the plurality of apertures 12. Accordingly, a different subset of the beam may be selected based on the different geometry of the different aperture that is intersected by the optical axis.

Figure 1B:
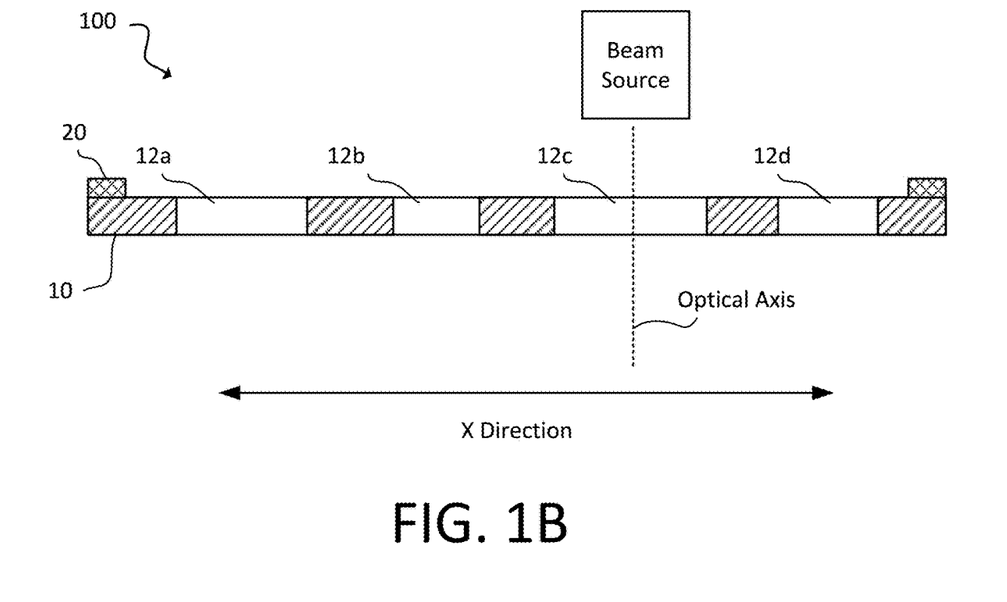
FIG. 1B is a sectional side view of the embodiment shown in FIG. 1A.

According to an embodiment of the present disclosure, the plurality of apertures 12 may be arranged one dimensionally in the array body 10. For example, as shown in FIG. 1A, the plurality of apertures 12 may be arranged linearly, such that the center point of each of the apertures 12 are collinear. In this way, the array body 10 can be moved along a single axis, perpendicular to the optical axis, to change which aperture 12 is intersected by the optical axis. For example, as shown in FIG. 1B, the hexagonal aperture 12c is currently selected, as it is coincident to the optical axis. A different aperture (e.g., the rectangular aperture 12b or the second hexagonal aperture 12d) may selected by moving the array body along the X direction (left or right in FIG. 1B).

According to an embodiment of the present disclosure, the aperture array 100 may comprise a linear actuator 14x. As shown in FIG. 1A, the linear actuator 14x may be configured to move the array body 10 relative to the optical axis of the beam source in an X direction. The X direction may be perpendicular to the optical axis. In this way, the linear actuator 14x may move the array body 10 along a single axis to change which aperture 12 is intersected by the optical axis.

Figure 2B:
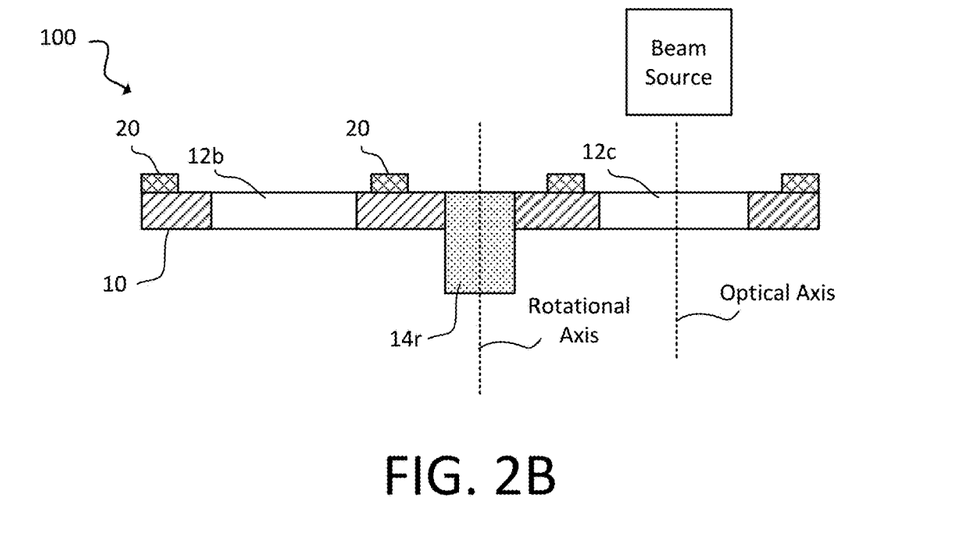
FIG. 2B is a sectional side view of the embodiment shown in FIG. 2A.

Alternatively, as shown in FIG. 2A, the plurality of apertures 12 may be arranged circularly, such that the center point of each of the apertures 12 are concyclic. In this way, the array body 10 can be rotated about a single axis, parallel to the optical axis, to change which aperture 12 is intersected by the optical axis. For example, as shown in FIG. 2B, the hexagonal aperture 12c is currently selected, as it is coincident to the optical axis. A different aperture (e.g., the rectangular aperture 12b) may selected by rotating the array body about the rotational axis 180 degrees. Similarly, the circular aperture 12a or the second hexagonal aperture 12d may be selected by rotating the array body 10 about the rotational axis 90 degrees and −90 degrees, respectively.

According to an embodiment of the present disclosure, the aperture array 100 may comprise a rotatory actuator 14r. As shown in FIGS. 2A and 2B, the rotary actuator 14r may be configured to rotate the array body 10 in a circumferential direction about a rotational axis. The rotational axis may be perpendicular to the array body 10 and parallel to the optical axis. The center point of each of the plurality of apertures 12 may be the same distance from the rotational axis. In this way, the rotary actuator 14r may rotate the array body 10 to change which aperture 12 is intersected by the optical axis.

According to an embodiment of the present disclosure, the plurality of apertures 12 may be arranged two dimensionally in the array body 10. For example, as shown in FIG. 3A, the plurality of apertures 10 may be arranged in a grid, such that the center point of each of the apertures 12 correspond to an X-Y location on the grid. In this way, the array body 10 can be moved along two axes, each perpendicular to the optical axis, to change which aperture 12 is intersected by the optical axis according to the X-Y location of each aperture 12.

Figure 3B:
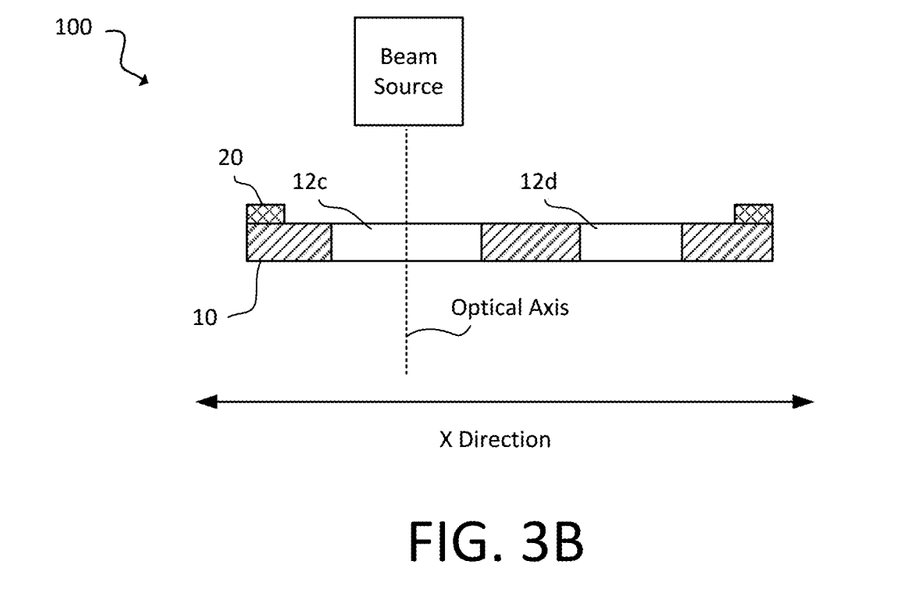
FIG. 3B is a sectional side view of the embodiment shown in FIG. 3A.
Figure 3C:
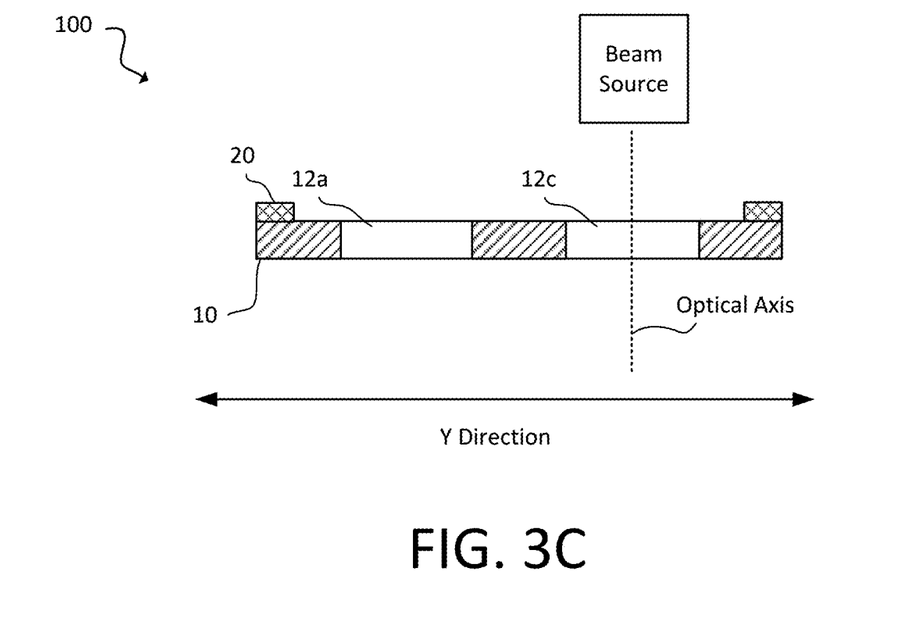
FIG. 3C is another sectional side view of the embodiment shown in FIG. 3A, orthogonal to the view shown in FIG. 3B.

According to an embodiment of the present disclosure, the aperture array 100 may comprise a pair of linear actuators 14x, 14y. As shown in FIG. 3A, the pair of linear actuators 14x, 14y may be configured to move the array body 10 relative to the optical axis of the beam source in an X direction and a Y direction, respectively. For example, one of the linear actuators 14x may be configured to move the array body 10 in the X direction, and the other of the linear actuators 14y may be configured to move the array body 10 in the Y direction. The X direction and the Y direction may be perpendicular to the optical axis and perpendicular to each other. In this way, the array body 10 can be moved along two axes to change which aperture 12 is intersected by the optical axis according to the X-Y location of each aperture 12. For example, as shown in FIG. 3B, the hexagonal aperture 12c is currently selected, as it is coincident to the optical axis. A different aperture (e.g., the second hexagonal aperture 12d) may selected by moving the array body along the X direction (right in FIG. 3B). In addition, as shown in FIG. 3C, a different aperture (e.g., the circular aperture 12a) may be selected by moving the array body along the Y direction (left in FIG. 3C). Similarly, a different aperture (e.g., the rectangular aperture 12b) may be selected by moving the array body along the X direction and the Y direction.

According to an embodiment of the present disclosure, the aperture array 100 may comprise a heat dissipation device 20 disposed on the array body 10. The heat dissipation device 20 may be disposed on top side of the array body 10, on the bottom side of the array body 10, or on both sides of the array body 10. Due to the heat generated by the beam source, the array body 10 may be exposed to high heat. In order to prevent damage to the array body 10, it may be desirable to dissipate heat from the array body 10, to maintain a temperature of the array body 10 of less than 10° C. The heat dissipation device 20 may be configured to actively or passively dissipate heat from the array body 10. For example, as shown in FIGS. 1-3, the heat dissipation device 20 may be one or more heat sinks disposed on the array body 10, which passively transfer heat from the array body 10 to the heat sinks. The heat dissipation device 20 may have thermal contact with the vacuum chamber body to passively transfer heat from the array body 10. The heat dissipation device 20 may include cooling channels which circulate a cooling fluid to the array body 10, which actively transfer heat from the array body 10 to the cooling fluid.

Figure 4:
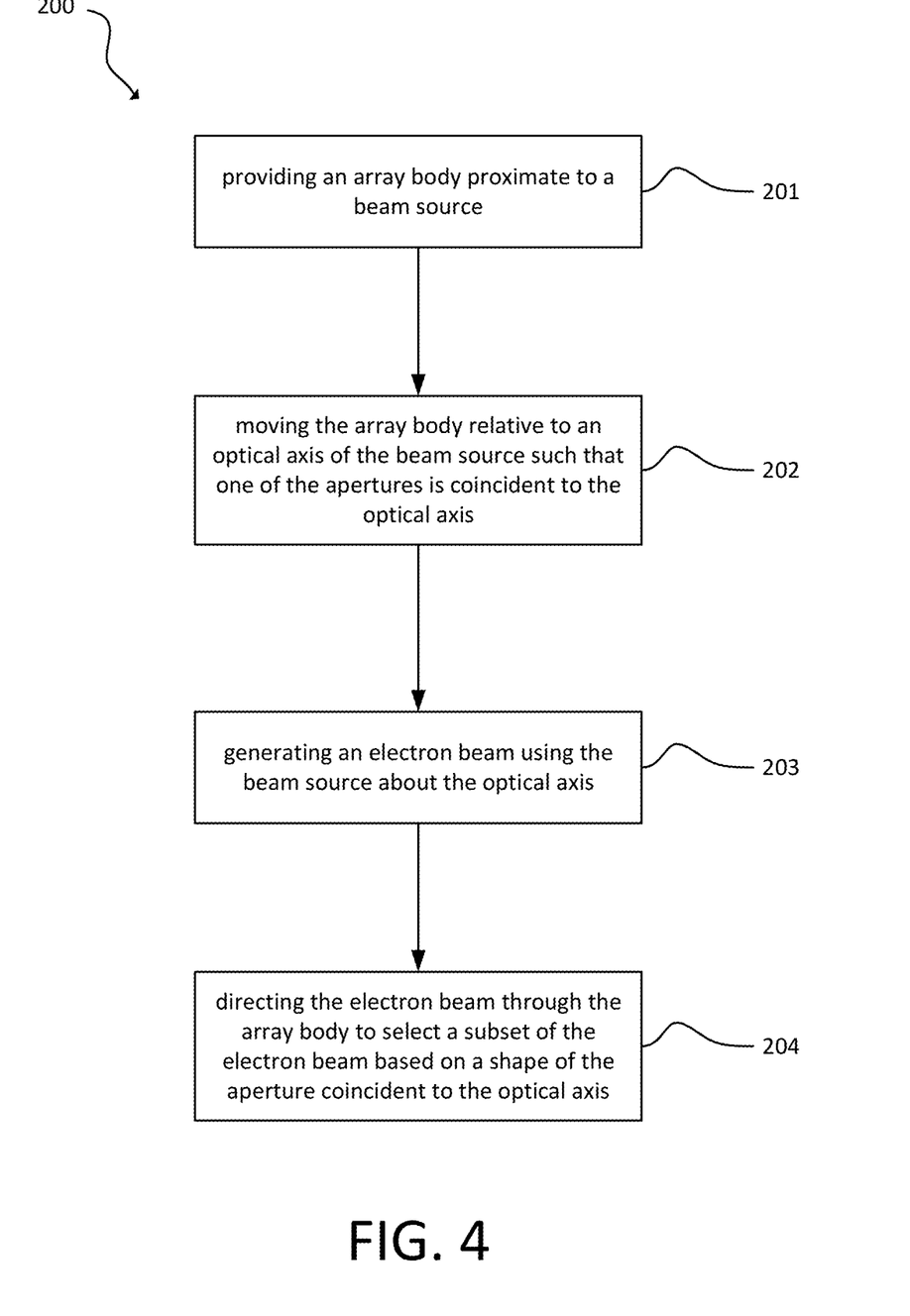
FIG. 4 is a flow chart of a method of selecting a subset of a beam from a multi-beam array system according to an embodiment of the present disclosure.

As shown in FIG. 4, an embodiment of the present disclosure provides a method 200 of selecting a subset of a beam from a multi-beam array system. The method 200 may comprise the following steps.

At step 201, an array body is provided proximate to a beam source. The array body may comprise a plurality of apertures, and at least two of the apertures may have different geometries. For example, each of the plurality of apertures may have a different size or a different shape. Each of the plurality of apertures may be suitable for particular operations of the multi-beam array system. For example, a circular aperture may be suitable for a hot spot inspection operation; a rectangular aperture may be suitable for a swathing operation; and a hexagonal aperture may be suitable for a step and settle operation. Two of the plurality of apertures may have the same shape but different sizes. A smaller sized aperture may have a higher resolution than a larger aperture of the same shape. By arranging the array body such that one of the plurality of apertures is intersected by the optical axis of the beam source, unnecessary beams from the beam source may be clipped by the array body, and not directed toward a wafer. Accordingly, a subset of the beam from the beam source may be selected based on the geometry of the aperture that is intersected by the optical axis.

At step 202, the array body is moved relative to an optical axis of the beam source such that one of the apertures is intersected by the optical axis. By moving the array body, a different one of the plurality of apertures may be intersected by the optical axis. Accordingly, a different subset of the beam may be selected based on the different geometry of the different aperture that is intersected by the optical axis.

The plurality of apertures may be arranged one dimensionally in the array body. For example, the plurality of apertures may be arranged linearly, such that the center point of each of the apertures are collinear. In this way, the array body can be moved along a single axis, perpendicular to the optical axis, to change which aperture is intersected by the optical axis. A linear actuator may be provided, which may be configured to move the array body relative to the optical axis of the beam source in an X direction, perpendicular to the optical axis. Thus, step 202 may comprise moving the array body, via the linear actuator, in an X direction, such that one of the apertures is intersected by the optical axis.

The plurality of apertures may be arranged circularly, such that the center point of each of the apertures are concyclic. In this way, the array body can be rotated about a single axis, parallel to the optical axis, to change which aperture is intersected by the optical axis. A rotary actuator may be provided, which may be configured to rotate the array body in a circumferential direction about a rotational axis, perpendicular to the array body and parallel to the optical axis. Thus, step 202 may comprise rotating the array body, via the rotary actuator, in a circumferential direction, such that one of the apertures is intersected by the optical axis.

The plurality of apertures may be arranged two dimensionally in the array body. For example, the plurality of apertures may be arranged in a grid, such that the center point of each of the apertures correspond to an X-Y location on the grid. In this way, the array body can be moved along two axes, each perpendicular to the optical axis, to change which aperture is intersected by the optical axis according to the X-Y location of each aperture. A pair of linear actuators may be provided, which may be configured to move the array body relative to the optical axis of the beam source in an X direction and a Y direction, respectively, each perpendicular to the optical axis and perpendicular to each other. Thus, step 202 may comprise moving the array body, via the pair of linear actuators, in an X direction and a Y direction, such that one of the apertures is intersected by the optical axis.

At step 203, an electron beam is generated using the beam source about the optical axis.

At step 204, the electron beam is directed through the array body to select a subset of the electron beam based on a shape of the aperture intersected by the optical axis. Thus, only a fraction of the electron beam may pass through the aperture.

At least one of the plurality of apertures may be circular. A circular aperture may be suitable for a hot spot inspection operation. Thus, when the aperture intersected by the optical axis is circular, the method 200 may further comprise performing a hot spot inspection operation on a portion of a wafer positioned in the optical axis, downstream of the array body.

At least one of the plurality of apertures may be rectangular. A rectangular aperture may be suitable for a swathing operation. Thus, when the aperture intersected by the optical axis is rectangular, the method 200 may further comprise performing a swathing operation on a portion of a wafer positioned in the optical axis, downstream of the array body.

At least one of the plurality of apertures may be hexagonal. A hexagonal aperture may be suitable for a step and settle operation. Thus, when the aperture intersected by the optical axis is hexagonal, the method 200 may further comprise performing a step and settle operation on a portion of a wafer positioned in the optical axis, downstream of the array body.

With the method 200, different subsets of the electron beam may be selected by the following additional steps.

The array body is moved, via the actuator, relative to the optical axis of the beam source such that a different one of the apertures is intersected by the optical axis.

The electron beam is directed through the array body to select a different subset of the electron beam based on a shape of the different one of the apertures intersected by the optical axis.

Figure 5:
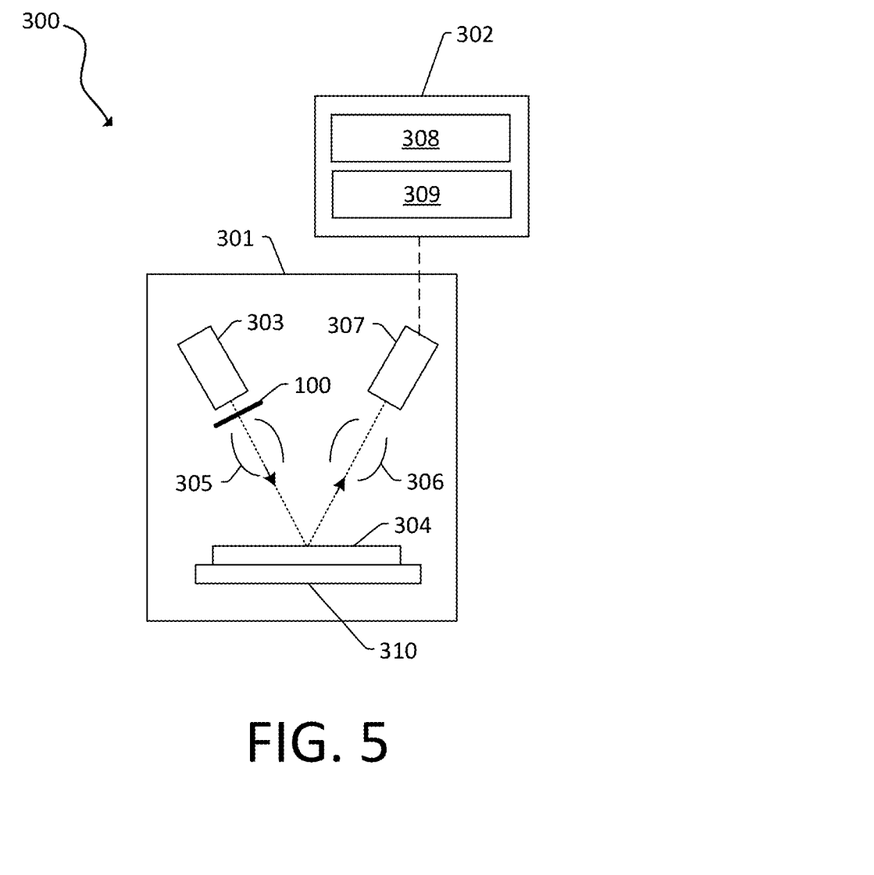
FIG. 5 is a block diagram of a multi-beam array system with an aperture array according to an embodiment of the present disclosure.

FIG. 5 is a block diagram of an embodiment of a system 300. The system 300 includes a wafer inspection tool (which includes the electron column 301) configured to generate images of a wafer 304.

The wafer inspection tool includes an output acquisition subsystem that includes at least an energy source and a detector. The output acquisition subsystem may be an electron beam-based output acquisition subsystem. For example, in one embodiment, the energy directed to the wafer 304 includes electrons, and the energy detected from the wafer 304 includes electrons. In this manner, the energy source may be an electron beam source. In one such embodiment shown in FIG. 5, the output acquisition subsystem includes electron column 301, which is coupled to computer subsystem 302. A stage 310 may hold the wafer 304.

As also shown in FIG. 5, the electron column 301 includes an electron beam source 303 configured to generate electrons that are focused to wafer 304 by one or more elements 305. The electron beam source 303 may include, for example, a cathode source or emitter tip. The one or more elements 305 may include, for example, a gun lens, an anode, a beam limiting aperture, a gate valve, a beam current selection aperture, an objective lens, and a scanning subsystem, all of which may include any such suitable elements known in the art. The aperture array 100 may be arranged proximate to the electron beam source 303, upstream of the one or more elements 305. In another embodiment, the aperture array 100 may be arranged proximate to the electron beam source 303 between two of the one or more elements 305. While only one beam is illustrated in FIG. 5, more than one electron beam source 303 may be provided, or the electron beam source may configured to emit an array of multiple beams.

Electrons returned from the wafer 304 (e.g., secondary electrons) may be focused by one or more elements 306 to detector 307. One or more elements 306 may include, for example, a scanning subsystem, which may be the same scanning subsystem included in element(s) 305.

The electron column 301 also may include any other suitable elements known in the art.

Although the electron column 301 is shown in FIG. 5 as being configured such that the electrons are directed to the wafer 304 at an oblique angle of incidence and are scattered from the wafer 304 at another oblique angle, the electron beam may be directed to and scattered from the wafer 304 at any suitable angles. In addition, the electron beam-based output acquisition subsystem may be configured to use multiple modes to generate images of the wafer 304 (e.g., with different illumination angles, collection angles, etc.). The multiple modes of the electron beam-based output acquisition subsystem may be different in any image generation parameters of the output acquisition subsystem.

Computer subsystem 302 may be coupled to detector 307 as described above. The detector 307 may detect electrons returned from the surface of the wafer 304 thereby forming electron beam images of the wafer 304. The electron beam images may include any suitable electron beam images. Computer subsystem 302 may be configured to generate images of the wafer 304 or perform any of the functions described herein using the output of the detector 307 and/or the electron beam images. Computer subsystem 302 may be configured to perform any additional step(s) described herein. A system 300 that includes the output acquisition subsystem shown in FIG. 5 may be further configured as described herein.

It is noted that FIG. 5 is provided herein to generally illustrate a configuration of an electron beam-based output acquisition subsystem that may be used in the embodiments described herein. The electron beam-based output acquisition subsystem configuration described herein may be altered to optimize the performance of the output acquisition subsystem as is normally performed when designing a commercial output acquisition system. In addition, the systems described herein may be implemented using an existing system (e.g., by adding functionality described herein to an existing system). For some such systems, the methods described herein may be provided as optional functionality of the system (e.g., in addition to other functionality of the system). Alternatively, the system described herein may be designed as a completely new system.

Although the output acquisition subsystem is described above as being an electron beam-based output acquisition subsystem, the output acquisition subsystem may be an ion beam-based output acquisition subsystem. Such an output acquisition subsystem may be configured as shown in FIG. 5 except that the electron beam source may be replaced with any suitable ion beam source known in the art. In addition, the output acquisition subsystem may be any other suitable ion beam-based output acquisition subsystem such as those included in commercially available focused ion beam (FIB) systems, helium ion microscopy (HIM) systems, and secondary ion mass spectroscopy (SIMS) systems.

The computer subsystem 302 includes a processor 308 and an electronic data storage unit 309. The processor 308 may include a microprocessor, a microcontroller, or other devices.

The computer subsystem 302 may be coupled to the components of the system 300 in any suitable manner (e.g., via one or more transmission media, which may include wired and/or wireless transmission media) such that the processor 308 can receive output. The processor 308 may be configured to perform a number of functions using the output. The wafer inspection tool can receive instructions or other information from the processor 308. The processor 308 and/or the electronic data storage unit 309 optionally may be in electronic communication with another wafer inspection tool, a wafer metrology tool, or a wafer review tool (not illustrated) to receive additional information or send instructions.

The processor 308 is in electronic communication with the wafer inspection tool, such as the detector 307 or the actuator for the aperture array 100. The processor 308 may be configured to process images generated using measurements from the detector 307 or select an aperture in the aperture array 100.

The computer subsystem 302, other system(s), or other subsystem(s) described herein may be part of various systems, including a personal computer system, image computer, mainframe computer system, workstation, network appliance, internet appliance, or other device. The subsystem(s) or system(s) may also include any suitable processor known in the art, such as a parallel processor. In addition, the subsystem(s) or system(s) may include a platform with high-speed processing and software, either as a standalone or a networked tool.

The processor 308 and electronic data storage unit 309 may be disposed in or otherwise part of the system 300 or another device. In an example, the processor 308 and electronic data storage unit 309 may be part of a standalone control unit or in a centralized quality control unit. Multiple processors 308 or electronic data storage units 309 may be used.

The processor 308 may be implemented in practice by any combination of hardware, software, and firmware. Also, its functions as described herein may be performed by one unit, or divided up among different components, each of which may be implemented in turn by any combination of hardware, software and firmware. Program code or instructions for the processor 308 to implement various methods and functions may be stored in readable storage media, such as a memory in the electronic data storage unit 309 or other memory.

If the system 300 includes more than one computer subsystem 302, then the different subsystems may be coupled to each other such that images, data, information, instructions, etc. can be sent between the subsystems. For example, one subsystem may be coupled to additional subsystem(s) by any suitable transmission media, which may include any suitable wired and/or wireless transmission media known in the art. Two or more of such subsystems may also be effectively coupled by a shared computer-readable storage medium (not shown).

The processor 308 may be configured to perform a number of functions using the output of the system 300 or other output. For instance, the processor 308 may be configured to send the output to an electronic data storage unit 309 or another storage medium. The processor 308 may be further configured as described herein.

The processor 308 or computer subsystem 302 may be part of a defect review system, an inspection system, a metrology system, or some other type of system. Thus, the embodiments disclosed herein describe some configurations that can be tailored in a number of manners for systems having different capabilities that are more or less suitable for different applications.

The processor 308 may be configured according to any of the embodiments described herein. The processor 308 also may be configured to perform other functions or additional steps using the output of the system 300 or using images or data from other sources.

The processor 308 may be communicatively coupled to any of the various components or sub-systems of system 300 in any manner known in the art. Moreover, the processor 308 may be configured to receive and/or acquire data or information from other systems (e.g., inspection results from an inspection system such as a review tool, a remote database including design data and the like) by a transmission medium that may include wired and/or wireless portions. In this manner, the transmission medium may serve as a data link between the processor 308 and other subsystems of the system 300 or systems external to system 300.

Various steps, functions, and/or operations of system 300 and the methods disclosed herein are carried out by one or more of the following: electronic circuits, logic gates, multiplexers, programmable logic devices, ASICs, analog or digital controls/switches, microcontrollers, or computing systems. Program instructions implementing methods such as those described herein may be transmitted over or stored on carrier medium. The carrier medium may include a storage medium such as a read-only memory, a random access memory, a magnetic or optical disk, a non-volatile memory, a solid state memory, a magnetic tape, and the like. A carrier medium may include a transmission medium such as a wire, cable, or wireless transmission link. For instance, the various steps described throughout the present disclosure may be carried out by a single processor 308 (or computer subsystem 302) or, alternatively, multiple processors 308 (or multiple computer subsystems 302). Moreover, different sub-systems of the system 300 may include one or more computing or logic systems. Therefore, the above description should not be interpreted as a limitation on the present disclosure but merely an illustration.

While described with respect to electron beams, the aperture array 100 also can be used with ion beam or other particle beam systems.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:

1. An aperture array for a multi-beam array system with multiple beams, comprising:
    an array body arranged proximate to a beam source, the array body comprising a plurality of apertures, wherein at least two of the apertures have different geometries, wherein each of the apertures has a dimension less than a beam dimension of the beams, and wherein at least one of the plurality of apertures is hexagonal;
    wherein the array body is movable, via an actuator, relative to an optical axis of the beam source, such that a subset of a beam from the beam source is selected based on the geometry of the aperture that is intersected by the optical axis and such that when the aperture intersected by the optical axis is hexagonal, the actuator is configured to perform a step and settle operation on a portion of a wafer positioned in the optical axis downstream of the array body.

2. The aperture array of claim 1, wherein at least one of the plurality of apertures is circular.

3. The aperture array of claim 1, wherein at least one of the plurality of apertures is rectangular.

4. The aperture array of claim 1, wherein two of the plurality of apertures have a same shape with different sizes.

5. The aperture array of claim 1, wherein the plurality of apertures are arranged one dimensionally in the array body.

6. The aperture array of claim 5, wherein the actuator comprises:
    a linear actuator configured to move the array body relative to the optical axis of the beam source in an X direction;
    wherein the X direction is perpendicular to the optical axis.

7. The aperture array of claim 5, wherein the actuator comprises:
    a rotary actuator configured to rotate the array body relative to the optical axis of the beam source about a rotational axis;
    wherein the rotational axis is parallel to the optical axis.

8. The aperture array of claim 1, wherein the plurality of apertures are arranged two dimensionally in the array body.

9. The aperture array of claim 8, wherein the actuator comprises:
    a pair of linear actuators configured to move the array body relative to the optical axis of the beam source in an X direction and a Y direction, respectively;
    wherein the X direction and the Y direction are perpendicular to the optical axis and perpendicular to each other.

10. The aperture array of claim 1, wherein the array body is comprised of aluminum nitride, polycrystalline diamond, graphite, molybdenum, or tungsten.

11. The aperture array of claim 1, further comprising:
    a heat dissipation device disposed on the array body, the heat dissipation device being configured to actively or passively dissipate heat from the array body.

12. The aperture array of claim 1, wherein a distance between the array body and the beam source is from 10 cm to 20 cm.

13. The aperture array of claim 1, wherein the beam source is an electron beam source.

14. A method of selecting a subset of a beam from a multi-beam array system with multiple electron beams, the method comprising:
    providing an array body proximate to a beam source, the array body comprising a plurality of apertures, wherein at least two of the apertures have different geometries, wherein each of the apertures has a dimension less than a beam dimension of the electron beams, and wherein at least one of the plurality of apertures is hexagonal;
    moving the array body, via an actuator, relative to an optical axis of the beam source such that one of the apertures is intersected by the optical axis;
    generating the electron beams about the optical axis using the beam source;

directing one of the electron beams through the array body to select a subset of the electron beam based on a shape of the aperture intersected by the optical axis; and performing a step and settle operation on a portion of a wafer positioned in the optical axis, downstream of the array body when the aperture intersected by the optical axis is hexagonal.

15. The method of claim 14, wherein at least one of the plurality of apertures is circular, and when the aperture intersected by the optical axis is circular, the method further comprises:

performing a hot spot inspection operation on a portion of a wafer positioned in the optical axis, downstream of the array body.

16. The method of claim 14, wherein at least one of the plurality of apertures is rectangular, and when the aperture intersected by the optical axis is rectangular, the method further comprises:

performing a swathing operation on a portion of a wafer positioned in the optical axis, downstream of the array body.

17. The method of claim 14, further comprising:

moving the array body, via the actuator, relative to the optical axis of the beam source such that a different one of the apertures is intersected by the optical axis; and directing the electron beam through the array body to select a different subset of the electron beam based on a shape of the different one of the apertures intersected by the optical axis.

18. The method of claim 14, wherein a distance between the array body and the beam source is from 10 cm to 20 cm.

* * * * *